(12) United States Patent
Howe (10) Patent No.: US 11,099,774 B2
(45) Date of Patent: Aug. 24, 2021

(54) COMMAND ADDRESS INPUT BUFFER BIAS CURRENT REDUCTION

(71) Applicant: Micron Technology, Inc., Boise, ID (US)

(72) Inventor: Gary Howe, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 609 days.

(21) Appl. No.: 15/691,447

(22) Filed: Aug. 30, 2017

(65) Prior Publication Data

US 2019/0065106 A1 Feb. 28, 2019

(51) Int. Cl.
```
G06F 3/00       (2006.01)
G11C 11/00      (2006.01)
G06F 3/06       (2006.01)
G11C 11/408     (2006.01)
G11C 11/4096    (2006.01)
G11C 7/10       (2006.01)
G11C 11/4076    (2006.01)
G11C 8/12       (2006.01)
```
(52) U.S. Cl.
CPC .......... *G06F 3/0659* (2013.01); *G06F 3/0604* (2013.01); *G06F 3/0673* (2013.01); *G11C 7/109* (2013.01); *G11C 7/1045* (2013.01); *G11C 11/4087* (2013.01); *G11C 11/4096* (2013.01); *G11C 8/12* (2013.01); *G11C 11/4076* (2013.01)

(58) Field of Classification Search
None
See application file for complete search history.

(56) References Cited

U.S. PATENT DOCUMENTS

| | | | | |
|---|---|---|---|---|
| 5,815,028 | A * | 9/1998 | Reynolds | G05F 1/575 327/535 |
| 6,037,813 | A * | 3/2000 | Eto | G06F 1/12 327/156 |
| 2004/0071033 | A1 | 4/2004 | Marotta et al. | |
| 2006/0038591 | A1* | 2/2006 | Pan | H03K 19/018528 327/108 |
| 2008/0279031 | A1* | 11/2008 | Kwon | G11C 5/147 365/227 |
| 2009/0059707 | A1* | 3/2009 | Jung | G11C 7/103 365/230.02 |

(Continued)

OTHER PUBLICATIONS www.overclockers.com, "Manually setting timing", Mar. 13, 2012, https://www.overclockers.com/forums/showthread.php/702398-Manually-setting-timing.*

(Continued)

*Primary Examiner* — Reginald G Bragdon
*Assistant Examiner* — Michael L Westbrook
(74) *Attorney, Agent, or Firm* — Fletcher Yoder, P.C.

(57) ABSTRACT

A memory device may include one or more memory banks that store data and one or more input buffers. The input buffers may receive command address signals to access the one or more memory banks. The memory device may operate in one of a first mode of operation or a second mode of operation. The one or more input buffers may operate under a first bias current when the memory device is in the first mode of operation or a second bias current when the memory device is in the second mode of operation, and the first bias current may be greater than the second bias current.

23 Claims, 4 Drawing Sheets

(56) References Cited

U.S. PATENT DOCUMENTS

| | | | |
|---|---|---|---|
| 2009/0256733 A1* | 10/2009 | Kim .................... | H03M 1/002 341/136 |
| 2010/0156488 A1 | 6/2010 | Kim et al. | |
| 2013/0229293 A1* | 9/2013 | Standley ............... | H03M 1/002 341/122 |
| 2014/0064010 A1 | 3/2014 | Barkley et al. | |
| 2015/0016195 A1* | 1/2015 | Yu ........................ | G11C 7/1084 365/189.05 |
| 2015/0155023 A1 | 6/2015 | Lee et al. | |
| 2015/0213855 A1* | 7/2015 | Chung ................. | G11C 11/4076 365/189.11 |
| 2015/0235691 A1 | 8/2015 | Kwak | |
| 2016/0079924 A1* | 3/2016 | Ogawa .................. | H03M 3/422 341/143 |
| 2017/0098473 A1 | 4/2017 | Di Vincenzo et al. | |
| 2017/0287546 A1* | 10/2017 | Ryu .................... | G11C 7/1003 |

OTHER PUBLICATIONS

PCT International Search Report & Written Opinion for PCT Application No. PCT/US2018/028892 dated Jul. 31, 2018; 14 Pages.

EP Search Report for EP Application No. 18850106.8 , dated Feb. 10, 2021 (8 pages).

* cited by examiner

COMMAND ADDRESS INPUT BUFFER BIAS CURRENT REDUCTION

BACKGROUND

Field of the Present Disclosure

Embodiments of the present disclosure relate generally to the field of semiconductor devices. More specifically, embodiments of the present disclosure relate to command address input buffer bias current reduction.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A semiconductor memory device, such as a dynamic random-access memory (DRAM), may utilize more than one operative mode for reading commands from another device such as a processor, motherboard, digital storage medium, or another DRAM.

Embodiments of the present disclosure may be directed to one or more of the features set forth above.

BRIEF DESCRIPTION OF DRAWINGS

FIG. 3 is a simplified block diagram illustrating certain features of the command interface of FIG. 1, according to an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A semiconductor memory device, such as a dynamic random-access memory (DRAM), may utilize more than one operative mode for reading commands from another device such as a processor, motherboard, digital storage medium, or another DRAM. Some DRAMs, such as a DDR5 SDRAM (double data rate type five synchronous dynamic random access memory), may be capable of operating in modes such as 1N and/or 2N modes.

Commands read by the DRAM may require one, two, or more cycles to communicate the command. When utilizing the 1N mode, the DRAM may read commands on every clock cycle. That is to say two one-cycle commands or one two-cycle command could be read in the period of two cycles. However, when utilizing the 2N mode, the DRAM may read commands by skipping a cycle between commands, and/or during commands. For example, two one-cycle commands may be separated by a skipped cycle, and a two-cycle command may have a skipped cycle in the middle requiring at least three cycles to read the command.

The 1N and 2N modes for reading commands may be influenced based on the frequency of the clock cycle. At higher clock frequencies, more biasing current may be employed to maintain the 1N mode and read/switch on every cycle. In some instances, the command bus may become so encumbered and/or attempt to maintain such a high frequency clock cycle that it cannot read/switch every cycle in a stable manner. In such instances, the 2N mode may be desired. However, the high biasing current that may be employed for the 1N mode may not be required while utilizing the 2N mode, allowing for a reduction in input buffer bias current. Embodiments of the present disclosure may provide techniques for reducing an input biasing current when operating in the 2N mode.

Figure 1:
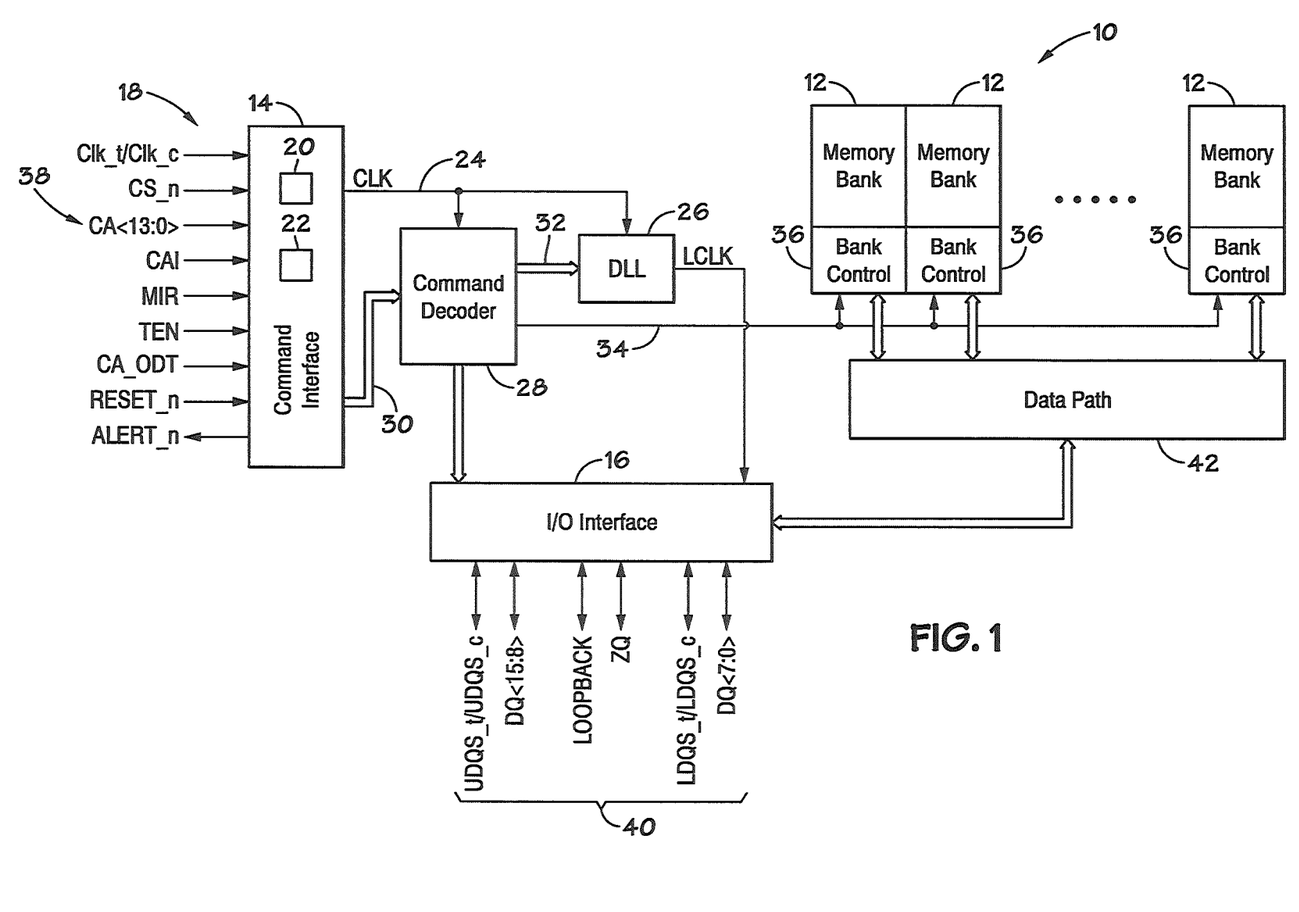
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 18) from an external device (not shown), such as a processor or controller. The processor or controller may provide various signals 18 to the memory device 10 to facilitate the transmission and receipt of data to be written to or read from the memory device 10.

As will be appreciated, the command interface 14 may include a number of circuits, such as a clock input circuit 20 and a command address input circuit 22, for instance, to ensure proper handling of the signals 18. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 20 receives the true clock signal (Clk_t/) and the complementary clock signal (Clk_c) and generates an internal clock signal CLK 24. The internal clock signal CLK 24 is supplied to an internal clock generator 26, such as a delay locked loop (DLL) circuit. The internal clock generator 26 generates a phase controlled internal clock signal LCLK based on the received internal clock signal CLK 24. The phase controlled internal clock signal LCLK is supplied to the I/O interface 16, for instance, and is used as a timing signal for determining an output timing of read data.

The internal clock signal CLK 24 may also be provided to various other components within the memory device 10 and may be used to generate various additional internal clock signals. For instance, the internal clock signal CLK 24 may be provided to a command decoder 28. The command decoder 28 may receive command signals from the command bus 30 and may decode the command signals to provide various internal commands. For instance, the command decoder 28 may provide command signals to the internal clock generator 26 over the bus 32 to coordinate generation of the phase controlled internal clock signal LCLK. The phase controlled internal clock signal LCLK may be used to clock data through the IO interface 16, for instance.

Further, the command decoder 28 may decode commands, such as read commands, write commands, mode-register set commands, activate commands, etc., and provide access to a particular memory bank 12 corresponding to the command, via the bus path 34. As will be appreciated, the memory device 10 may include various other decoders, such as row decoders and column decoders, to facilitate access to the memory banks 12. In one embodiment, each memory bank 12 includes a bank control block 36 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address (CA) signals 38 received from an external device, such as a processor. In one embodiment, the command/address bus may be a 14-bit bus to accommodate the command/address signals (CA<13:0>) 38. The CA signals 38 are clocked to the command interface 14 using the clock signals (Clk_t/ and Clk_c). The command interface 14 may include a CA input circuit 22 which is configured to receive and transmit the commands to provide access to the memory banks 12, through the command decoder 28, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of CA signals 38 on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 40 through the IO interface 16. More specifically, the data may be sent to or retrieved from the memory banks 12 over the datapath 42, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
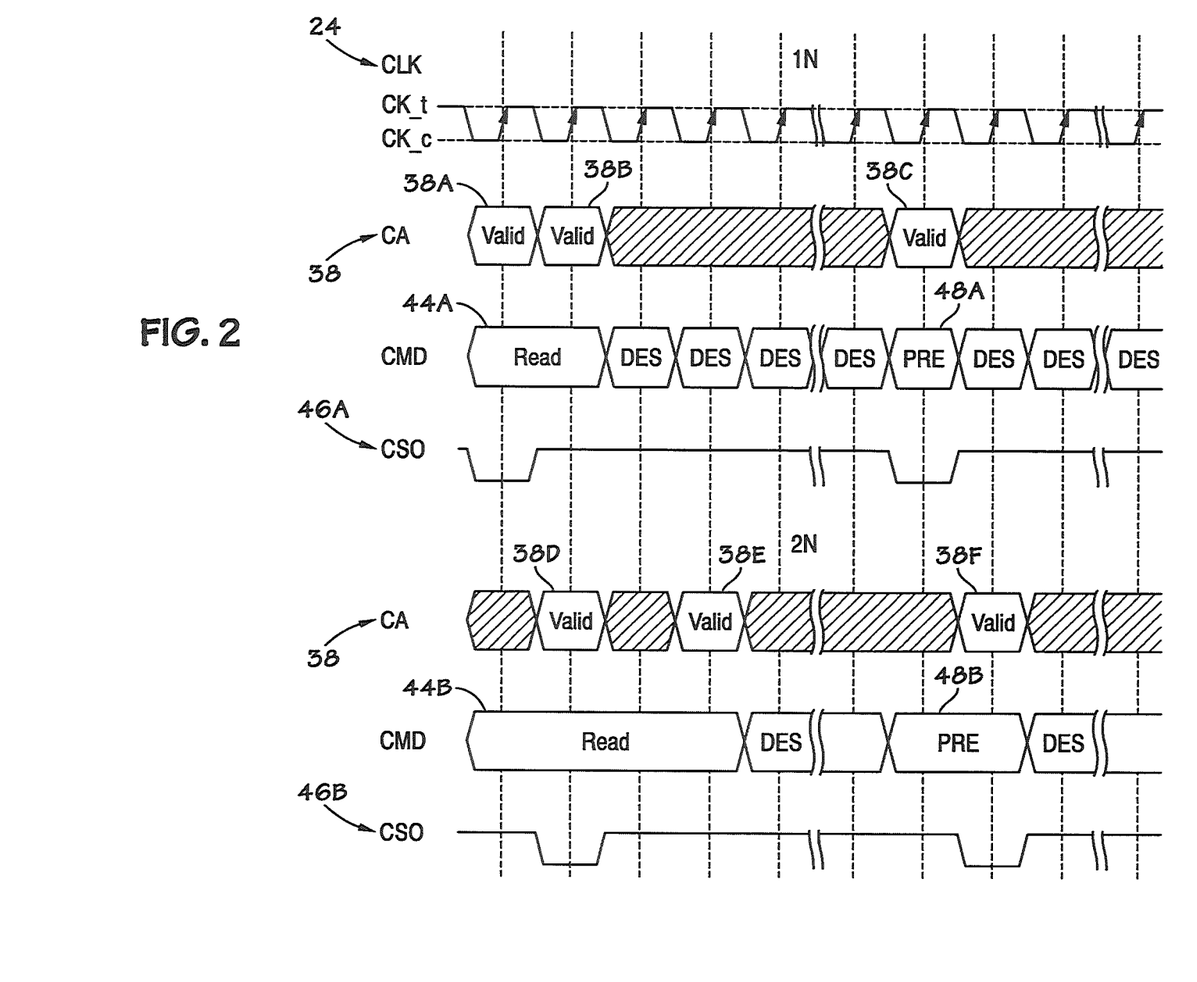
FIG. 2 is a timing diagram illustrating example 1N and 2N mode commands, according to an embodiment of the present disclosure.

The memory device 10 may employ one or more operating modes, such as the 1N and/or 2N modes, when receiving CA signals 38 such as read/write commands. These commands may employ one, two, or more clock cycles to communicate the command. FIG. 2 depicts an example timing diagram to illustrate the difference between the 1N and 2N modes of operation. When utilizing the 1N mode, the memory device 10 may capture commands on every clock cycle. For example, the two-cycle "read" command 44A may have two sets of information to be communicated to the memory device 10 via the command/address bus. For example, the first set of CA signals 38A may contain a specific command and part of an address, and the second set of CA signals 38B may contain the rest of the address. Additionally, the memory device 10 may be triggered to receive the CA signals 38, carrying the "read" command 44A, by a chip select zero (CS0) signal 46A. Such a CS0 signal 46A may transition from a high state to a low state (i.e. transition to a set low voltage reference point) to indicate to the memory device 10 to read a command. When employing the 1N mode, the CA signals 38B may be captured sequentially on the next clock cycle after CA signals 38A are captured. As one skilled in the art would appreciate, any suitable control signal could be utilized in the place of the CS0 signal 46 transitioning to a low state (e.g., a signal transitioning to a high state, a rising or falling edge signal, etc.).

Additionally, a one-cycle command, such as a "precharge" command 48A being carried by CA signals 38C, may be captured when the CS0 signal 46A transitions to a low state, without consideration of the previous command. That is to say, when operating in the 1N mode, a number of one-cycle commands may be read in just as many cycles. In contrast, the 2N mode may skip a clock cycle between one-cycle commands. In one embodiment, whenever the CS0 signal 46B transitions to a low state, the memory device 10 reacts by capturing the current command, and ignoring the next clock cycle, thereby creating a one-cycle gap between commands. For example, when CA signals 38F, carrying pre-charge command 48B, are read, the cycle following the read of CA signals 38F may be ignored, and no commands may be captured.

Similarly, when a two-cycle command, such as a "read" command 44B, is sent to the memory device 10 a clock cycle may be skipped between CA signals 38D and CA signals 38E. When CS0 46B, for example, transitions to a low state, the first set of CA signals 38D are captured by the command interface 14, but the clock cycle immediately after may be skipped before reading the second set of CA signals 38E. Thus, it may take a minimum of three clock cycles to fully read a two-cycle command when operating in the 2N mode.

The election of the 1N or 2N mode may be done by user selection or automatically by the memory device 10 or an external processor. Additionally, it may be desired to engage the 2N mode specifically at higher clock frequencies. At high clock frequencies, more biasing current may be required to maintain the 1N mode and read/switch on every cycle. In some instances, the CA input circuit 22 may become so encumbered and/or attempt to maintain such a high clock frequency that it cannot read/switch every cycle in a stable manner. In such instances, the memory device 10 may switch to a 2N mode to provide more setup and hold on the CA bus. However, the high biasing current that was set for the 1N mode, due to the longer capture time and drive requirements, may not be required while utilizing the 2N mode allowing for a reduction in input buffer bias current.

FIG. 3 illustrates one embodiment of the CA input circuit 22 utilizing an input buffer 50. As CA signals 38 are received by the memory device 10, they may be held in a buffer stage prior to being decoded by the command decoder 28. The CA signals 38 may first be compared to an approximately constant voltage from a CA voltage reference generator 52. Such a CA voltage reference generator 52 may be within an element of the memory device 10, or included in a separate power supply. The constant voltage signal and CA signals 38 are compared to determine the "high" or "low" state of each CA signal 38. Once the high or low state of a CA signal is known, the high or low signal may be sent from the input buffer 50 to a latch 54. Using the internal clock signal CLK 24, the latch 54 may control the timing of the CA signals 38, as they are passed down the command bus 30 to the command decoder 28.

When employing the 1N mode of operation, each input buffer 50 switches on every clock cycle to account for a possible change in the respective incoming CA signal 38. In order to maintain switching on every clock cycle, the input buffer 50 may employ a bias current of approximately 500 microamps (µA), although, the bias current requirement may vary depending on clock frequency and components used within the memory device 10. For example, the bias current in the 1N mode may be between 200 µA and 1000 µA.

On the other hand, when utilizing the 2N mode, clock cycles between commands are skipped, giving the input buffer more time to compare the CA signal 38 to the CA voltage reference generator 52, and switch as necessary. Thus, the switching rate of the input buffer 50 is less in the 2N mode. This lower switching rate may, therefore, be achieved utilizing less bias current to operate in a continuous and stable condition. In one embodiment, the input buffer bias current while utilizing the 2N mode may be decreased to 50% of that of the 1N mode at the same clock frequency. In other embodiments, the input buffer bias current may be between 20% and 80% of the input buffer bias current in the 1N mode. Furthermore, in some embodiments, the clock frequency may be increased, from that of the 1N mode, in the 2N mode and still result in an input buffer bias current reduction. For example, the clock frequency may be increased by 5%, 25%, 50%, or 75%, but when utilizing the 2N mode, the switching rate for the input buffer 50 may still be slower than that of the 1N mode operating at the original clock frequency. Therefore, the input buffer 50 may still require less bias current in the 2N mode.

To initiate the 2N mode, a 2N signal 56 may be asserted to the input buffer 50. The 2N signal 56 may be generated internally to the memory device 10, for example via a multi-purpose command (MPC), or may be received from an external component such as a motherboard or processor. Upon assertion, the 2N signal 56 controls the bias current for the input buffer 50. The input buffer bias current may then be decreased, and may increase the electrical efficiency of the memory device 10 and/or decrease heat generation.

Figure 4:
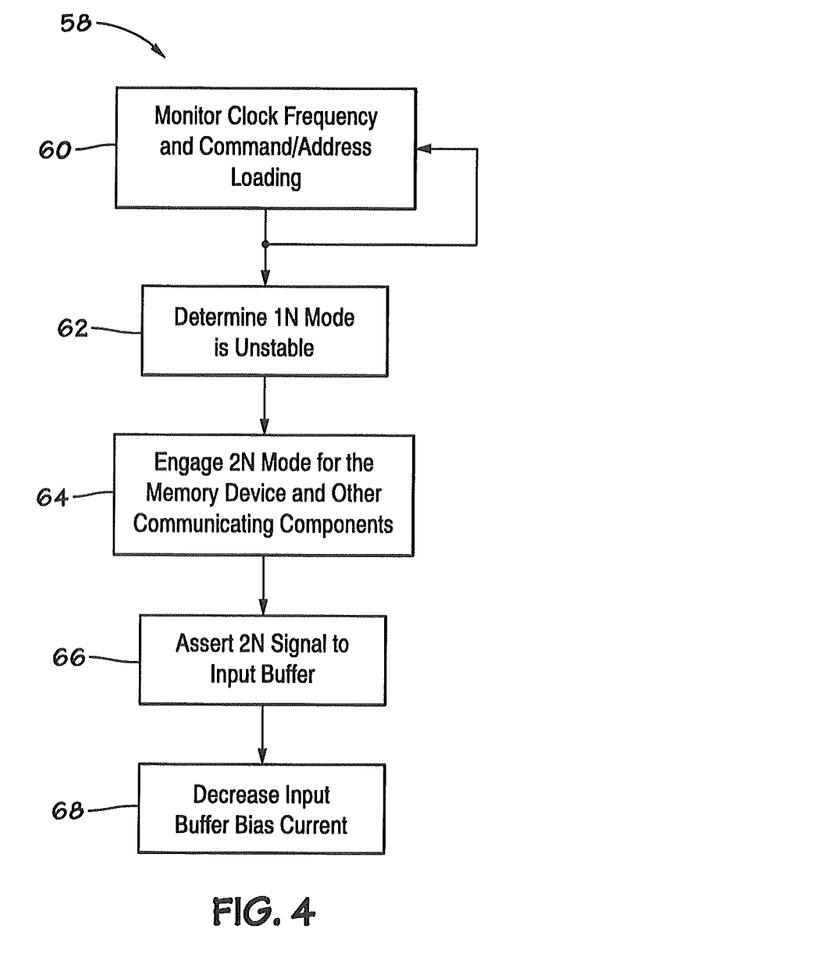
FIG. 4 is a flowchart illustrating a technique for decreasing input buffer bias current, according to an embodiment of the present disclosure.
Figure 5:
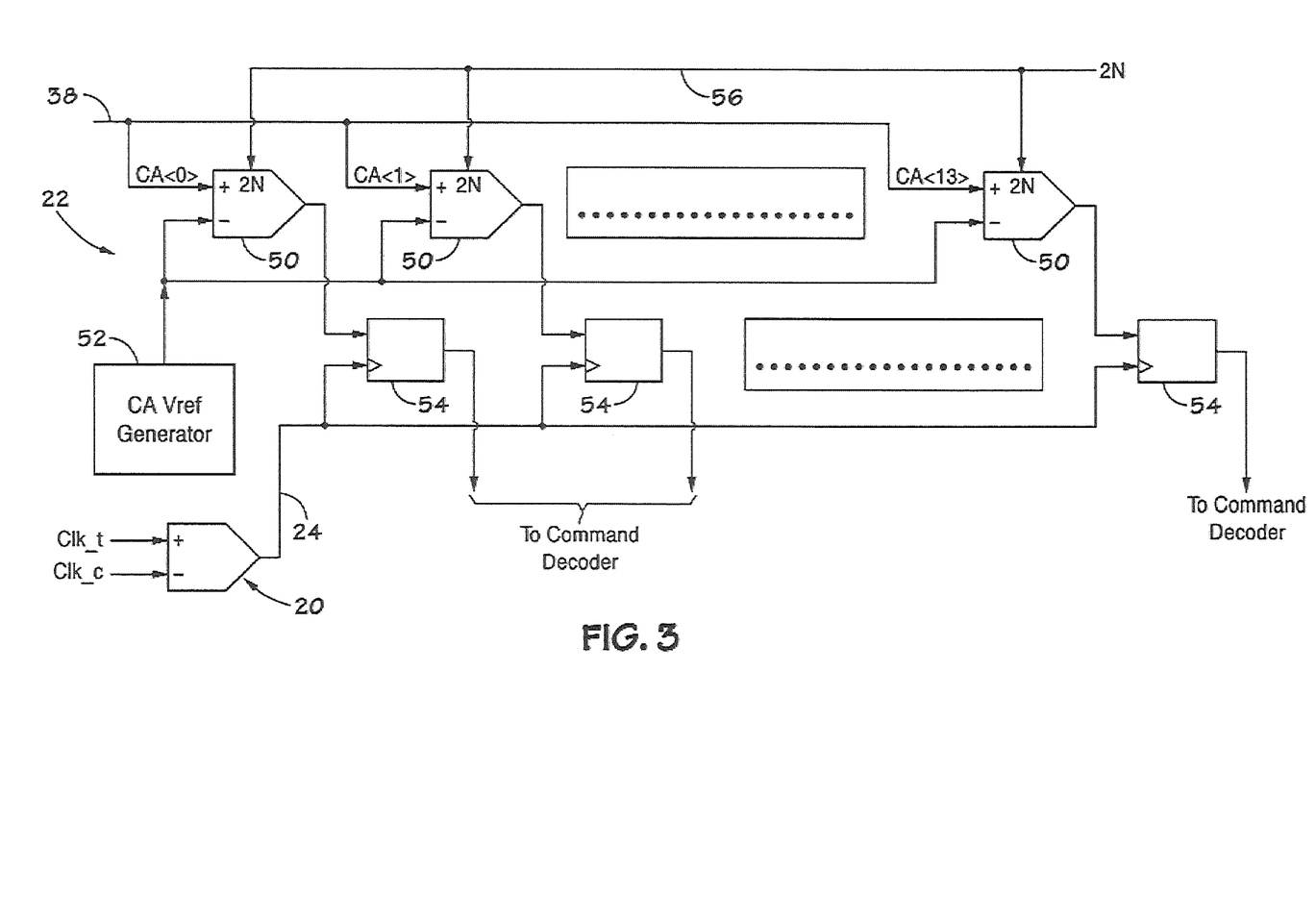

FIG. 4 illustrates a process 58 for selecting the 2N mode and decreasing the input buffer bias current in accordance with an embodiment of the technique. In the flowchart of FIG. 4, the process 58 begins by monitoring the clock frequency, the command/address loading, and any other characteristics of the memory device 10 that may warrant a shift to the 2N mode (process block 60). This monitoring may be continuous until the 1N mode is deemed unstable (process block 62). If the 1N mode is determined to be unstable, such as if the input buffer cannot switch fast enough to maintain the clock frequency, the 2N mode may be engaged for the memory device 10 as well as any other components communicating with the memory device 10, such as a motherboard, processor, or other computer hardware element (process block 64). Assertion of the 2N signal 56 to the input buffers 50 (process block 66) may then decrease the input buffer bias current in the CA input circuit (process block 68). Although the process 58 is shown in a given order, it should be appreciated that certain portions of the flow chart may be reordered, deleted, and/or occur simultaneously.

Furthermore, should the memory device 10 be implemented in a computer system (e.g., a personal computer, laptop, smartphone, etc.) or within a component of a computer system (e.g., a graphics card, motherboard, etc.), the 2N mode selection and subsequent decrease in input buffer bias current may be implemented due to various factors. For example, the 2N mode and decrease in input buffer bias current may be initiated due to monitoring of a present condition within the computer system or the memory device 10, as in process block 60. However, in other embodiments, the 2N mode and input buffer bias current may be selected automatically by the computer system and/or the memory device 10 upon initialization of the computer system and/or the memory device 10. Additionally, the 2N mode and the input buffer bias current may be user selected and adjusted.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
one or more memory banks configured to store data; and
one or more input buffers configured to receive command address signals to access the one or more memory banks;
wherein the memory device is configured to operate in each of a first mode of operation and a second mode of operation; and
wherein the one or more input buffers are configured to operate under a first bias current when the memory device is in the first mode of operation and configured to operate under a second bias current when the memory device is in the second mode of operation, and wherein the first bias current is greater than the second bias current, wherein the memory device is configured to operate in conjunction with a clock signal, wherein the clock signal has a clock frequency, and wherein the clock frequency is faster in the second mode of operation than in the first mode of operation.

2. The memory device of claim 1, wherein the memory device is a dynamic random-access memory device.

3. The memory device of claim 2, wherein the dynamic random-access memory device is a double data rate type five synchronous dynamic random access memory device.

4. The memory device of claim 1, wherein the first mode of operation is a 1N mode, and the second mode of operation is a 2N mode.

5. The memory device of claim 1, wherein the first bias current is approximately 500 microamps (μA).

6. The memory device of claim 1, wherein the second bias current is approximately 50% of the first bias current.

7. The memory device of claim 1, comprising a command decoder configured to receive the command address signals from the one or more input buffers and wherein the command decoder is configured to decode the command address signals.

8. The memory device of claim 1, wherein the command address signals comprise a two-cycle command.

9. The memory device of claim 1, wherein the memory device is configured to be implemented in a system with a motherboard and a processor.

10. The memory device of claim 1, wherein the one or more input buffers are configured to receive a 2N signal, that when asserted, causes the one or more input buffers to switch from the first bias current to the second bias current.

11. The memory device of claim 1, wherein the command address signals are temporarily stored in the one or more input buffers.

12. A memory device comprising:
one or more memory banks configured to store data; and
a command address input circuit configured to receive command address signals to access the one or more memory banks, wherein the command address input circuit comprises one or more input buffers configured to receive the command address signals, a voltage reference signal, and a mode signal,
wherein the one or more input buffers are configured to compare the command address signals to the voltage reference signal to determine a state of the command address signals,
wherein the one or more input buffers are configured to operate at a first current when the mode signal is not asserted, and the one or more input buffers are configured to operate at a second current when the mode signal is asserted, wherein the first current is greater than the second current,
wherein, when the mode signal is asserted, the one or more input buffers are configured to skip one or more clock cycles while receiving the command address signals or comparing the command address signals.

13. The memory device of claim 12, wherein command address input circuit comprises a command address voltage reference generator, wherein the command address voltage reference generator is configured to provide the voltage reference signal to the one or more input buffers.

14. The memory device of claim 12, wherein the command address input circuit comprises one or more latches configured to receive the state of the command address signals from the one or more input buffers.

15. The memory device of claim 14, wherein the latches are configured to utilize a clock signal to regulate a transmission of the state of the command address signals.

16. The memory device of claim 12, wherein the mode signal is asserted upon initialization of the memory device.

17. The memory device of claim 12, wherein the mode signal is asserted based upon a selection by a user of the memory device.

18. The memory device of claim 12, wherein the second bias current of the second mode of operation is automatically adjusted based on at least a clock signal.

19. A method comprising:
receiving, at a memory device, a mode signal;
engaging, at the memory device, one of a first mode of operation or a second mode of operation based at least on the mode signal;
decreasing a bias current of an input buffer of the memory device when the second mode of operation is engaged; and
in response to the second mode of operation being engaged, skipping one or more clock cycles while receiving the command address signals or comparing the command address signals.

20. The method of claim 19, wherein the mode signal is provided to the memory device by an external device.

21. The method of claim 19, comprising monitoring, at the memory device, a clock frequency, a command address loading, or both to determine an optimal mode between the first mode of operation and the second mode of operation.

22. The method of claim 21, comprising asserting, within the memory device, the mode signal to the input buffer, wherein the mode signal decreases the bias current of the input buffer.

23. The method of claim 19, wherein the bias current, when in the second mode of operation, is between 20% and 80% of the bias current when in the first mode of operation.

* * * * *